(12) United States Patent  
Buss

(10) Patent No.: US 11,820,329 B2
(45) Date of Patent: Nov. 21, 2023

(54) ILLUMINATED VEHICLE KEY FOB DEVICE

(71) Applicant: Bradley Buss, Grand Junction, CO (US)

(72) Inventor: Bradley Buss, Grand Junction, CO (US)

( * ) Notice: Subject to any disclaimer, the term of this patent is extended or adjusted under 35 U.S.C. 154(b) by 72 days.

(21) Appl. No.: 17/532,097

(22) Filed: Nov. 22, 2021

(65) Prior Publication Data

US 2023/0034203 A1 Feb. 2, 2023

Related U.S. Application Data

(60) Provisional application No. 63/226,850, filed on Jul. 29, 2021.

(51) Int. Cl.
*B60R 25/00* (2013.01)
*B60R 25/24* (2013.01)
*B60R 25/25* (2013.01)
*B60R 25/20* (2013.01)
*F21V 23/04* (2006.01)
*H05K 5/00* (2006.01)
*B60R 25/40* (2013.01)
(Continued)

(52) U.S. Cl.
CPC .......... *B60R 25/24* (2013.01); *B60R 25/209* (2013.01); *B60R 25/252* (2013.01); *B60R 25/406* (2013.01); *F21V 23/0457* (2013.01); *G06V 40/13* (2022.01); *H05K 5/0086* (2013.01); *F21Y 2115/10* (2016.08)

(58) Field of Classification Search
CPC ..... B60R 25/24; B60R 25/209; B60R 25/252; B60R 25/406; G06V 40/13; F21V 23/0457
See application file for complete search history.

(56) References Cited

U.S. PATENT DOCUMENTS 7,369,061 B1 * 5/2008 Sellers .................. B60Q 1/482
701/2
2003/0117261 A1 * 6/2003 Gunsch .............. G07C 9/00563
340/5.72

(Continued)

OTHER PUBLICATIONS

Geemai "Wireless Keyboard and Mouse Combo Rechargeable, Full Size Wireless Keyboard with Backlit, 2.4G Silent USB Wireless Keyboard Mouse Combo [with USB C Adapter] for Windows, Mac OS Desktop/Laptop/PC" (Date First Available: Jul. 8, 2021) (Year: 2021).*

*Primary Examiner* — Gerald J Sufleta, II
(74) *Attorney, Agent, or Firm* — Brennan, Manna & Diamond, LLC

(57) ABSTRACT

The present invention relates generally to the field of vehicle key fobs. More specifically, the present invention relates to a vehicle key fob device comprised of a vehicle key fob that has a housing, a flashlight, a biometric scanner, a plurality of LED-illuminated buttons/emblems and a button that allows the color of the LED-illuminated buttons to change. The fob may have a plurality of buttons in differing embodiments, which are preferably illuminated via at least one LED that is positioned below each button. However, in one embodiment a singular large LED may sit below all buttons to illuminate the buttons simultaneously. The at least one LED can also produce any color known in the art, which can be changed by a user by pressing a color change button located on the side surface of the fob.

17 Claims, 3 Drawing Sheets

(51) Int. Cl.
*G06V 40/13* (2022.01)
*F21Y 115/10* (2016.01)

(56) References Cited

U.S. PATENT DOCUMENTS

| | | | | |
|---|---|---|---|---|
| 2005/0281021 | A1* | 12/2005 | Thompson | F21L 4/06 |
| | | | | 362/157 |
| 2009/0243791 | A1* | 10/2009 | Partin | G07C 9/00944 |
| | | | | 340/5.2 |
| 2011/0316684 | A1* | 12/2011 | Moulton | G07C 9/00944 |
| | | | | 340/426.36 |
| 2016/0189491 | A1* | 6/2016 | Sloo | G08C 23/04 |
| | | | | 345/173 |
| 2022/0219643 | A1* | 7/2022 | Hanson | G06V 40/172 |

* cited by examiner

ILLUMINATED VEHICLE KEY FOB DEVICE

CROSS-REFERENCE TO RELATED APPLICATION

The present application claims priority to, and the benefit of, U.S. Provisional Application No. 63/226,850, which was filed on Jul. 29, 2021 and is incorporated herein by reference in its entirety.

FIELD OF THE INVENTION

The present invention relates generally to the field of vehicle key fobs. More specifically, the present invention relates to a vehicle key fob device comprised of a vehicle key fob that has a housing, a flashlight, a biometric scanner, a plurality of LED-illuminated buttons/emblems and a button that allows the color of the LED-illuminated buttons to change. The fob may have a plurality of buttons in differing embodiments, which are preferably illuminated via at least one LED that is positioned below each button. However, in one embodiment a singular large LED may sit below all buttons to illuminate the buttons simultaneously. Accordingly, the present disclosure makes specific reference thereto. Nonetheless, it is to be appreciated that aspects of the present invention are also equally applicable to other like applications, devices and methods of manufacture.

BACKGROUND

Most vehicles come equipped with a key fob that can be used to lock/unlock and activate other functions of the vehicle. Modern key fobs may contain an internal key for vehicles that have key start ignitions or may simply allow push-to-start vehicles to start once the fob is inside the vehicle. Vehicle key fobs typically also have a plurality of buttons that activate various features of the vehicle. However, these buttons are only typically labeled with stickers or symbols that are of contrasting color to the rest of the fob. As a result, in night-time or dimly lit environments it may become incredibly difficult for a user to see which button on a key fob they are pressing. Further, in dark environments a user may need a flashlight in order to see his or her surroundings. Although nearly all mobile phones are equipped with a flashlight, an individual's mobile phone may not operate or may need charged in an instance where the flashlight is needed, which is undesirable. In addition, existing key fobs known in the art often contain the brand logo of the vehicle on the fob controls. However, this logo can also not be seen at night or in dimly lit conditions, which is undesirable for some users who wish to display the brand of their vehicle.

Therefore, there exists a long-felt need in the art for an improved vehicle key fob. There also exists a long-felt need in the art for a vehicle key fob that allows a user to easily view each button of the fob in dark or dimly lit conditions. Further, there exists a long-felt need in the art for a vehicle key fob that allows a user to easily view the vehicle brand logo on the fob in dark or dimly lit conditions. Finally, there exists a long-felt need in the art for a vehicle key fob that allows users to illuminate their surroundings as needed.

The subject matter disclosed and claimed herein, in one embodiment thereof, comprises a vehicle key fob device. The device is comprised of a vehicle key fob that has a housing, a flashlight, a biometric scanner, a plurality of LED-illuminated buttons/emblems and a button that allows the color of the LED-illuminated buttons to change. The fob may have a plurality of buttons in differing embodiments, which can include but is not limited to: an alarm button, a trunk button, a remote start button, a lock button and an unlock button. The buttons are preferably illuminated via at least one LED that is positioned below each button. However, in one embodiment a singular large LED may sit below all the buttons to illuminate all buttons simultaneously. The at least one LED can also produce any color known in the art. The color of the at least one LED can also be changed by a user by pressing a color change button located on the side surface of the fob.

In this manner, the vehicle key fob device of the present invention accomplishes all of the forgoing objectives and provides an improved vehicle key fob wherein all buttons/emblems of the fob can be illuminated. In addition, the flashlight of the fob provides a user with a light source that can be used when other light sources are not available. Finally, the biometric scanner provides an improved security measure to deter theft of the fob and the vehicle that the fob controls.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some general concepts in a simplified form as a prelude to the more detailed description that is presented later.

The subject matter disclosed and claimed herein, in one embodiment thereof, comprises a vehicle key fob device. The device is comprised of a vehicle key fob that has a housing, a flashlight, a biometric scanner, a plurality of LED-illuminated buttons/emblems and a button that allows the color of the LED-illuminated buttons to change. The fob may have a plurality of buttons in differing embodiments, which can include but is not limited to: an alarm button, a trunk button, a remote start button, a lock button and an unlock button. The buttons are preferably illuminated via at least one LED that is positioned below each button. However, in one embodiment a singular large LED may sit below all buttons to illuminate the buttons simultaneously. The at least one LED can also produce any color known in the art, which can be changed by a user by pressing a color change button located on the side surface of the fob.

The illumination of the buttons is further controlled by an on/off button. In addition, one embodiment of the fob may have a light sensor that detects the amount of light surrounding the fob and automatically illuminates the buttons when the amount of light reads from the sensor as below a pre-determined threshold value. By pressing and holding the on/off button for a prolonged period, the user can also raise/lower the brightness of the buttons as desired.

The fob is powered by an internal battery that may be a disposable battery or a rechargeable battery in the form of an alkaline, nickel-cadmium, nickel-metal hydride battery, etc., such as any 3V-12 volt DC battery or other conventional battery such as A, AA, AAA, etc., that can supply power to the fob. In the preferred embodiment, the battery is rechargeable via a USB port, preferably located on the side surface of the fob. In differing embodiments, the port may be a USB-A, USB-B, Micro-B, Micro-USB, Mini-USB, or USB-C port, etc.

The bottom surface of the fob is comprised of an emblem that may be in the form of a personal logo, initials, monogram or the brand logo of the vehicle that the fob controls. Like the buttons, the emblem is preferably illuminated via at least one LED that is positioned below the emblem. Further, the at least one LED can produce any color known in the art, which can be changed by a user by pressing a color change button. In the preferred embodiment, the LED of the emblem is also powered by the same battery as the at least one LED of each button. In addition, the fob may be comprised of a LED flashlight that is also powered by the battery.

The housing also has a continuous opening that allows a key ring to be secured to the housing via a cord that is fed through the opening, and is fixedly or removably-attached to the key ring. In this manner, the fob can be easily attached to various items that can receive a key ring. The fob may also contain a biometric scanner that allows users to store at least one of their fingerprints. Therefore, if a differing user (i.e., a user whose fingerprint does not match any fingerprint stored within the scanner) attempts to use the fob, the scanner will shut off the fob's transponder to disable the fob's ability to communicate with a vehicle via the transponder.

Accordingly, the vehicle key fob device of the present invention is particularly advantageous as it allows for the buttons and emblem of a key fob to be illuminated as necessary. In addition, the fob provides a flashlight that can be used as needed. Further, the fob provides improved security via the biometric scanner, which protects a vehicle against theft.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and are intended to include all such aspects and their equivalents. Other advantages and novel features will become apparent from the following detailed description when considered in conjunction with the drawings.

BRIEF DESCRIPTION OF THE DRAWINGS

The description refers to provided drawings in which similar reference characters refer to similar parts throughout the different views, and in which.

DETAILED DESCRIPTION OF THE INVENTION

Figure 1:
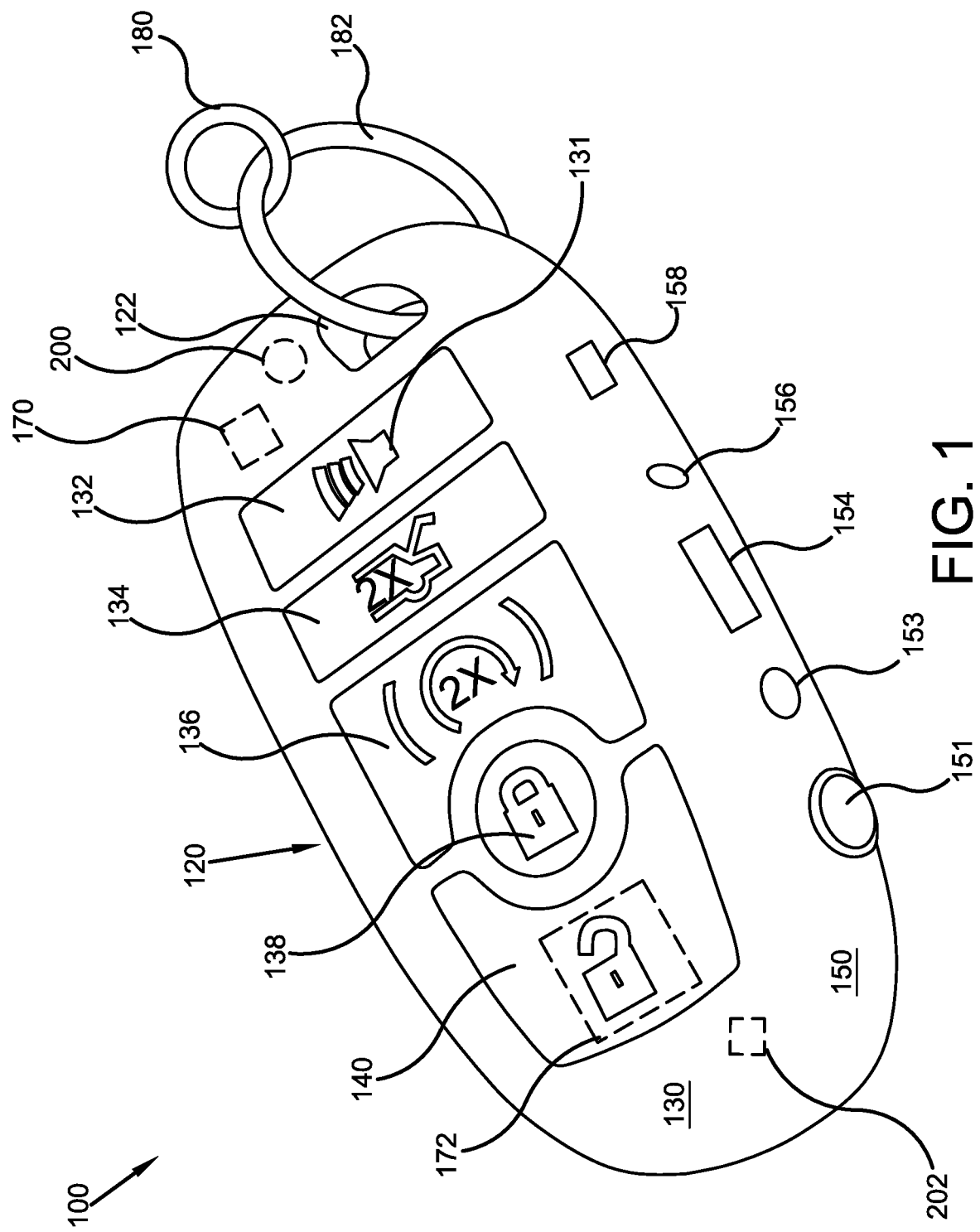
FIG. 1 illustrates a top perspective view of one embodiment of a vehicle key fob device of the present invention in accordance with the disclosed architecture.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof. Various embodiments are discussed hereinafter. It should be noted that the figures are described only to facilitate the description of the embodiments. They are not intended as an exhaustive description of the invention and do not limit the scope of the invention. Additionally, an illustrated embodiment need not have all the aspects or advantages shown. Thus, in other embodiments, any of the features described herein from different embodiments may be combined.

As noted above, there is a long-felt need in the art for an improved vehicle key fob. There also exists a long-felt need in the art for a vehicle key fob that allows a user to easily view each button of the fob and the vehicle brand logo of the fob in dark or dimly lit conditions. Finally, there exists a long-felt need in the art for a vehicle key fob that allows a user to illuminate his or her surroundings as needed.

The present invention, in one exemplary embodiment, is comprised of a vehicle key fob device that has a housing, a flashlight, a biometric scanner, a plurality of LED-illuminated buttons/emblems and a button that allows the color of the LED-illuminated buttons to change. In differing embodiments, the buttons of the fob can include but are not limited to: an alarm button, a trunk button, a remote start button, a lock button and an unlock button. The buttons are preferably illuminated via at least one LED that is positioned below each button, or by a singular large LED that sits below all buttons to illuminate the buttons simultaneously. In either embodiment, the at least one LED can also produce any color known in the art which can be changed by a user by pressing a color change button located on the side surface of the fob.

The illumination of the buttons is further controlled by an on/off button. In addition, one embodiment of the fob may have a light sensor that detects the amount of light surrounding the fob, and automatically illuminates the buttons when the amount of light read from the sensor is below a predetermined threshold value. By pressing and holding the on/off button for a prolonged period, the user can also raise/lower the brightness of the buttons as desired.

An internal battery powers the fob, wherein the battery may be a disposable battery or a rechargeable battery in the form of an alkaline, nickel-cadmium, nickel-metal hydride battery, etc., such as any 3V-12 volt DC battery or other conventional battery such as A, AA, AAA, etc., that can supply power to the fob. In a preferred embodiment, the battery is rechargeable via a USB port, preferably located on the side surface of the fob, wherein the port may be USB-A, USB-B, Micro-B, Micro-USB, Mini-USB, or USB-C port, etc.

An emblem is located on the bottom surface of the fob, wherein the emblem may be in the form of a personal logo, initials, monogram or the brand logo of the vehicle the fob controls. Like the buttons, the emblem is preferably illuminated via at least one LED that is positioned below the emblem. The at least one LED can also produce any color known in the art, which can be changed by a user by pressing a color change button. In a preferred embodiment, the LED of the emblem is also powered by the same battery as the at least one LED of each button. In addition, the fob may be comprised of a LED flashlight that is also powered by the battery.

A key ring can be secured to the housing via a cord that is fed through a continuous opening, wherein the cord is fixedly or removably-attached to the key ring. In this manner, the fob can be easily attached to various items that can receive a key ring. The fob may also contain a biometric scanner that allows users to store at least one of their fingerprints. Therefore, if a differing user (i.e.. a user whose fingerprint does not match any fingerprint stored within the scanner) attempts to use the fob, the scanner will then shut off the fob's transponder to disable the fob's ability to communicate with a vehicle via the transponder.

As such, the vehicle key fob device of the present invention is particularly advantageous as it allows for the buttons and emblem of a key fob to be illuminated as necessary. In addition, the fob provides a flashlight that can be used as needed. Further, the fob provides improved security via the biometric scanner, which protects a vehicle against theft.

Referring initially to the drawings, FIG. 1 illustrates a top perspective view of one embodiment of the vehicle key fob device 100 of the present invention. The fob device 100 is comprised of a housing 120 that has an LED flashlight bulb 152, a color changing button 156, a biometric scanner 154 and a plurality of LED-illuminated buttons that include but are not limited to: an alarm button 132, a trunk button 134, a remote start button 136, a lock button 138 and an unlock button 140. It is to be appreciated that the vehicle key fob device 100 contains all known functions and functional processes of existing vehicle key fobs known in the art, in addition to the novel improvements made and disclosed by the present invention. The housing 120 may be of any suitable shape or size known in the art, including any shape or size of any known vehicle key fob, as long as the housing 120 can retain the circuitry and batteries necessary to activate the different functions and provide power to the fob device 100. In addition, the housing 120 may have a plurality of thicknesses, including being a thin as a standard credit card. The housing 120 may be manufactured of a metal, such as but not limited to: stainless steel or aluminum, but may also be manufactured of other suitable materials as are known in the art. Said other materials include but are not limited to: carbon fiber and plastic such as but not limited to: acrylic, polycarbonate, polyethylene, thermoplastic, acrylonitrile butadiene styrene, low density polyethylene, medium density polyethylene, high density polyethylene, polyethylene terephthalate, polyvinyl chloride, polystyrene, polylactic acid, acetal, nylon, fiberglass, etc.

The top surface 130 of the housing 120 is further comprised of a plurality of buttons that include but are not limited to: an alarm button 132, a trunk button 134, a remote start button 136, a lock button 138 and an unlock button 140. However, it should be appreciated that the fob device 100 may also contain any button that corresponds to a suitable vehicle function known in the art, and is not limited to the button functions that are explicitly detailed in the present application for exemplary purposes. Further, each button 132, 134, 136, 138, 140 may be manufactured of the same suitable material as the housing 120, and may also be transparent or semi-transparent. In addition, each button 132, 134, 136, 138, 140 may contain indicia 131 in the form of a symbol, an icon, an emblem, words, etc., that illustrate the function of each button 132, 134, 136, 138, 140 such that each function can be ascertained by a user. Each button 132, 134, 136, 138, 140, is preferably illuminated via at least one LED 172 that is positioned below each button 132, 134, 136, 138, 140, such that each button 132, 134, 136, 138, 140 may individually or simultaneously illuminate. However, in one embodiment a singular large LED 172 may sit below all the buttons 132, 134, 136, 138, 140 to illuminate all buttons 132, 134, 136, 138, 140 simultaneously. Further, the at least one LED 172 can produce any suitable color known in the art, wherein the color of the at least one LED 172 can be changed by a user by pressing a color change button 156 located on the side surface 150 of the fob device 100. It should also be appreciated that in one embodiment, only the indicia 131 of the buttons 132, 134, 136, 138, 140 may be illuminated. In addition, the housing 120 itself or portions of the housing (ex. the edges) may be illuminated.

The fob device 100 is further powered by an internal battery 170. The internal battery 170 may be a disposable battery or a rechargeable battery in the form of an alkaline, nickel-cadmium, nickel-metal hydride battery, etc., such as any 3V-12 volt DC battery or other conventional battery such as A, AA, AAA, etc., that can supply power to the fob device 100. Throughout this specification the term "battery" refers to one or more wet or dry cells or batteries of cells in which chemical energy is converted into electricity and used as a source of DC power. References to recharging or replacing batteries may refer to recharging or replacing individual cells, individual batteries of cells or a package of multiple battery cells as is appropriate for any given battery technology that may be used. In the preferred embodiment, the internal battery 170 is rechargeable via a USB port 158, preferably located on the side surface 150 of the fob device 100. The port 158 may further be at least one of a USB-A, USB-B, Micro-B, Micro-USB, Mini-USB, or USB-C port, etc., or any other suitable port for charging the fob device 100 as is known in the art.

To control the illumination of the buttons 132, 134, 136, 138, 140, the fob device 100 comprises an on/off button 151. In addition, there is a light sensor 200 that detects the amount of light surrounding the fob device 100, and automatically illuminates the buttons 132, 134, 136, 138, 140 when the amount of light read from the sensor 200 is below a pre-determined threshold value. Further, by pressing and holding the on/off button 151 for a prolonged period of time, the user can also raise/lower the brightness of the buttons 132, 134, 136, 138, 140 as desired.

The housing 120 also comprises a continuous opening 122 that allows a key ring 180 to be secured to the housing 120 via a cord 182 that is fed through the opening 122 and is fixedly or removably-attached to the key ring 180. In this manner, the fob device 100 can be easily attached to various items such as a keychain (not shown), lanyard (not shown), backpack (not shown), etc., or any other suitable item that can receive a key ring 180 as is known in the art. For security purposes, the fob device 100 may also comprise a biometric scanner 154 that allows users to store at least one of their fingerprints in the fob device 100. In one embodiment, the biometric scanner 154 allows for storage of multiple fingerprints for multiple users associated with the vehicle. If a differing user (i.e.. a user whose fingerprint does not match any fingerprint stored within the biometric scanner 154) then attempts to use the fob device 100, and the biometric scanner 154 does not detect the stored fingerprint of the user, the biometric scanner 154 will shut off the fob device's 100 transponder 202 to disable the fob's ability to communicate with a vehicle (not shown). In differing embodiments, the transponder 202 may communicate with a vehicle via a plurality of communication mediums such as but not limited to: RFID, Bluetooth, Wi-Fi, etc., or any other suitable communication medium as is known in the art.

Figure 2:
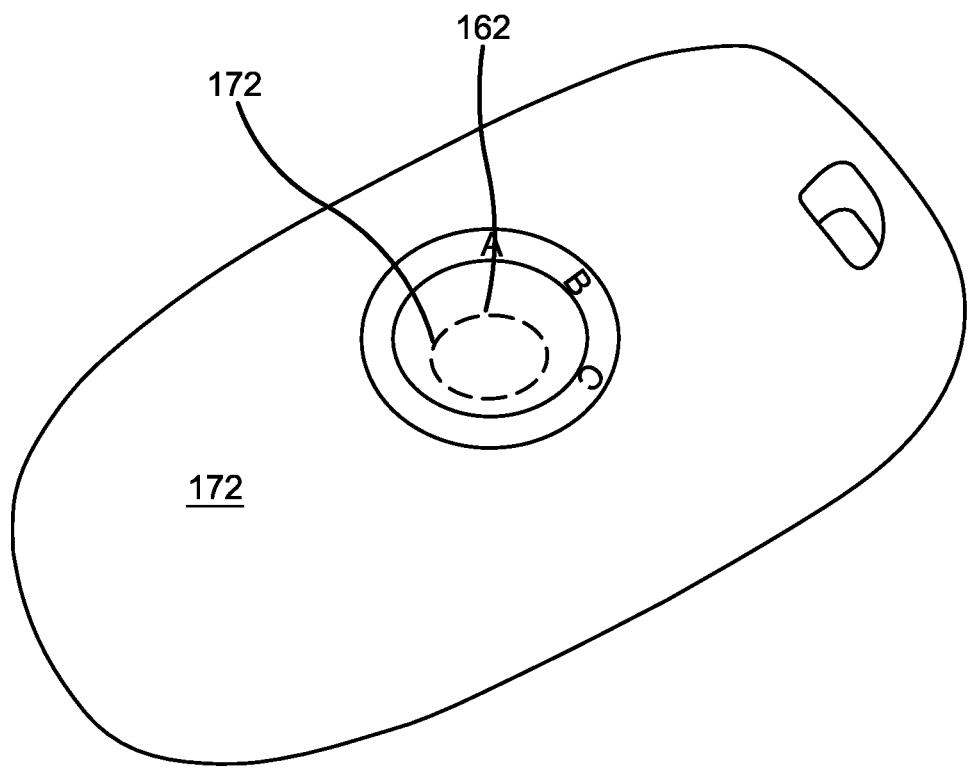
FIG. 2 illustrates a top perspective view of one embodiment of the vehicle key fob device of the present invention with the flashlight illuminated in accordance with the disclosed architecture.

FIG. 2 illustrates a top perspective view of one embodiment of the vehicle key fob device 100 of the present invention. The side surface 150 comprises an LED flashlight bulb 152 that is powered by the internal battery 170. The flashlight bulb 152 can be activated by a flashlight button 153 present on the top surface 130, side surface 150 or bottom surface 160, etc., of the housing 120. When the flashlight button 153 is depressed, the LED flashlight bulb 152 is illuminated as shown. In this manner, the flashlight bulb 152 can be used to easily and quickly illuminate a user's surroundings as per a user's wants and/or needs.

Figure 3:
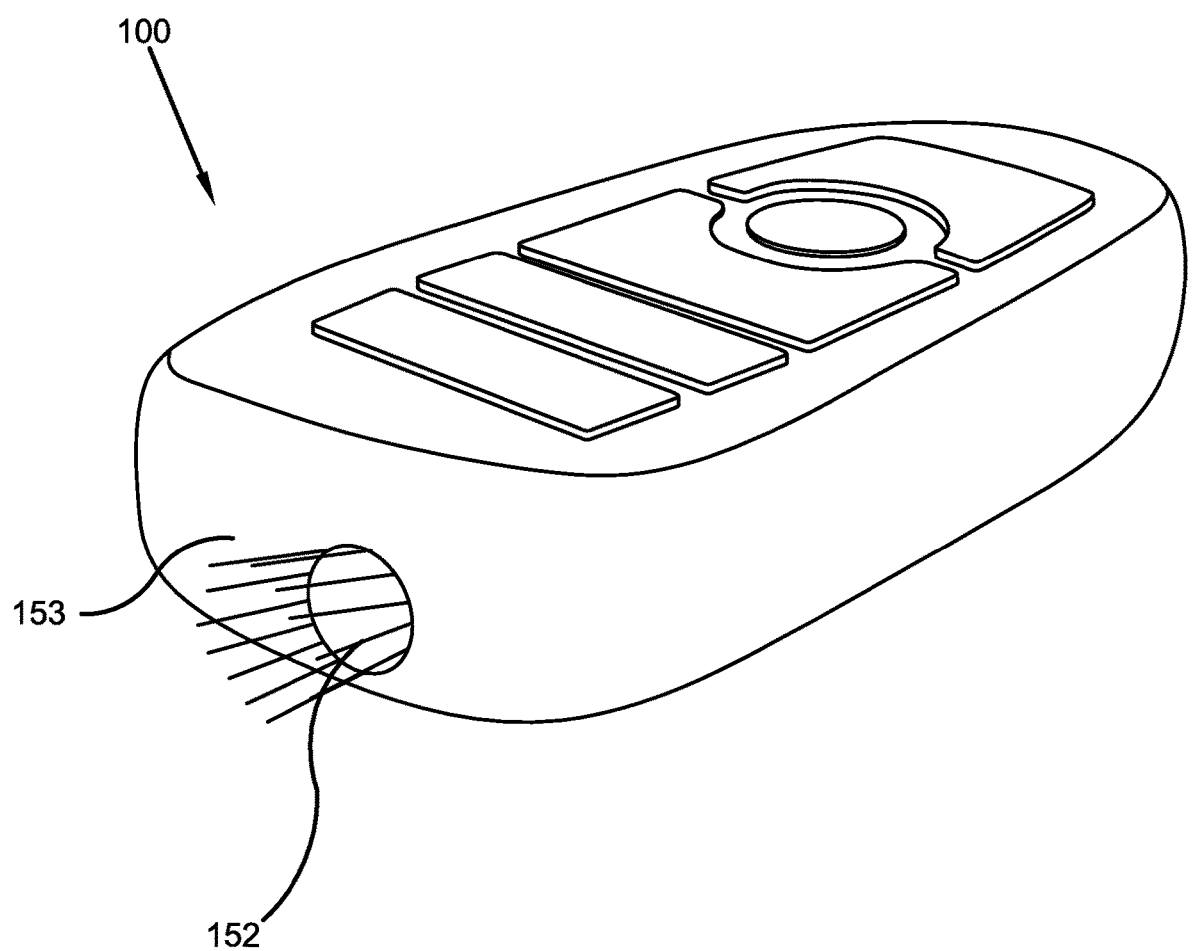
FIG. 3 illustrates a bottom perspective view of one embodiment of the vehicle key fob device of the present invention displaying the emblem in accordance with the disclosed architecture.

FIG. 3 illustrates a bottom view of one embodiment of the vehicle key fob device 100 of the present invention. The bottom surface 160 of the fob device 100 is preferably comprised of an emblem 162 that may be in the form of a personal logo, initials, monogram or the brand logo of the vehicle that the fob device 100 controls, etc., or any other suitable emblem as is known in the art. The emblem 162 may be manufactured of the same material as the housing 120, and may be transparent or semi-transparent. Similar to buttons 132, 134, 136, 138, 140, the emblem 162 is preferably illuminated via at least one LED 172 that is positioned below the emblem 162. Further, the at least one LED 172 can produce any suitable color known in the art, wherein the color of the at least one LED 172 can be changed by a user by pressing a color change button 156 located on the side surface 150 of the fob device 100 (shown in FIG. 1). In a preferred embodiment, the at least one LED 172 of the emblem 162 is also powered by the same internal battery 170 as the at least one LED 172 of each button 132, 134, 136, 138, 140.

Certain terms are used throughout the following description and claims to refer to particular features or components. As one skilled in the art will appreciate, different persons may refer to the same feature or component by different names. This document does not intend to distinguish between components or features that differ in name but not structure or function. As used herein "vehicle key fob device", "device", and "fob device", are interchangeable and refer to the vehicle key fob device 100 of the present invention.

Notwithstanding the forgoing, the vehicle key fob device 100 of the present invention and its various components can be of any suitable size and configuration as is known in the art without affecting the overall concept of the invention, provided that they accomplish the above-stated objectives. One of ordinary skill in the art will appreciate that the size, configuration and material of the vehicle key fob device 100 as shown in FIGS. 1-3 is for illustrative purposes only, and that many other sizes and shapes of the vehicle key fob device 100 are well within the scope of the present disclosure. Although the dimensions of the vehicle key fob device 100 are important design parameters for user convenience, the vehicle key fob device 100 may be of any size, shape and/or configuration that ensures optimal performance during use and/or that suits the user's needs and/or preferences.

Various modifications and additions can be made to the exemplary embodiments discussed without departing from the scope of the present invention. While the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A vehicle key fob device comprising:
   a housing further comprised of a top surface, a side surface, and a bottom surface;
   a plurality of buttons that each control a function of a vehicle;
   an illuminable logo located on the bottom surface;
   at least one LED;
   an internal battery for powering the at least one LED; and
   a light sensor, wherein the light sensor detects amount of light surrounding the vehicle key fob device and automatically illuminates the plurality of buttons when the amount of light reads as below a pre-determined threshold value; and
   wherein the at least one LED illuminates each of the plurality of buttons and the housing; and
   wherein each of the plurality of buttons comprise an illuminable indicia.

2. The vehicle key fob device of claim 1, wherein the at least one LED can produce a color that can be changed by a user by pressing a color change button on the housing.

3. The vehicle key fob device of claim 1 further comprising a USB port that allows the internal battery to recharge.

4. A vehicle key fob device comprising:
   a housing further comprised of a top surface, a side surface, and a bottom surface;
   a plurality of buttons that each control a function of a vehicle and that are located on the top surface;
   an illuminable logo located on the bottom surface;
   at least one LED that illuminates the plurality of buttons;
   at least one LED that illuminates the illuminable logo;
   an internal battery that powers the at least one LED that illuminates the plurality of buttons and the at least one LED that illuminates the illuminable logo;
   a biometric scanner configured to store a plurality of fingerprints for more than one user;
   a transponder; and
   a light sensor, wherein the light sensor detects an amount of light surrounding the vehicle key fob device and automatically illuminates the plurality of buttons when the amount of light is below a pre-determined threshold value, and further wherein the biometric scanner allows a user to store at least one fingerprint.

5. The vehicle key fob device of claim 4, wherein the at least one LED that illuminates the plurality of buttons and the at least one LED that illuminates the illuminable logo can illuminate in a color.

6. The vehicle key fob device of claim 5, wherein the color can be changed by a user by pressing a color change button on the housing.

7. A vehicle key fob device comprising:
   a housing further comprised of a top surface, a side surface, and a bottom surface;
   a plurality of buttons that each control a function of a vehicle;
   an illuminable logo;
   at least one LED that illuminates the plurality of buttons and the housing;
   at least one LED that illuminates the illuminable logo;
   a LED flashlight bulb;

a battery that powers the at least one LED that illuminates the plurality of buttons, the at least one LED that illuminates the illuminable logo, and the LED flashlight bulb;
a biometric scanner;
a power button;
a color changing button;
a USB port that allows the battery to recharge;
a key ring;
a cord;
a light sensor; and
an RFID transponder for communicating with a vehicle; and
wherein each of the plurality of buttons comprise an illuminable indicia.

8. The vehicle key fob device of claim 7, wherein the plurality of buttons that each control a function of a vehicle are an alarm button, a trunk button, a remote start button, a lock button, and an unlock button.

9. The vehicle key fob device of claim 8, wherein the plurality of buttons are transparent or semi-transparent.

10. The vehicle key fob device of claim 7, wherein the at least one LED that illuminates the plurality of buttons and the at least one LED that illuminates the illuminable logo are is positioned under each of the plurality of buttons and the illuminable logo.

11. The vehicle key fob device of claim 10, wherein the at least one LED that illuminates the plurality of buttons and the illuminable logo can produce a color that can be changed by a user by pressing the color changing button.

12. The vehicle key fob device of claim 7, wherein the light sensor detects an amount of light surrounding the vehicle key fob device and automatically illuminates the plurality of buttons when the amount of light is below a pre-determined threshold value.

13. The vehicle key fob device of claim 7, wherein a user can raise/lower a brightness of the plurality of buttons that each control a function of a vehicle by pressing and holding an on/off button for a prolonged period of time.

14. The vehicle key fob device of claim 7, wherein the housing is comprised of a continuous opening that allows the key ring to be secured to the housing via the cord.

15. The vehicle key fob device of claim 7, wherein the biometric scanner allows a user to store at least one fingerprint.

16. The vehicle key fob device of claim 15, wherein if the biometric scanner does not detect the at least one fingerprint of the user that is stored within the biometric scanner when a finger is placed on the biometric scanner, the biometric scanner shuts off the transponder and prevents the transponder from communicating with a vehicle.

17. The vehicle key fob device of claim 7, wherein the plurality of buttons that each control a function of a vehicle are located on the top surface, and the illuminable logo is located on the bottom surface.

* * * * *